US012720865B2

(12) United States Patent
Chen et al.

(10) Patent No.: US 12,720,865 B2
(45) Date of Patent: Aug. 25, 2026

(54) DISPLAY PANELS

(71) Applicant: WUHAN CHINA STAR OPTOELECTRONICS SEMICONDUCTOR DISPLAY TECHNOLOGY CO., LTD., Wuhan (CN)

(72) Inventors: Gui Chen, Wuhan (CN); Hengyi Li, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 452 days.

(21) Appl. No.: 18/233,850

(22) Filed: Aug. 14, 2023

(65) Prior Publication Data

US 2024/0339458 A1 Oct. 10, 2024

Related U.S. Application Data

(63) Continuation of application No. PCT/CN2023/093737, filed on May 12, 2023.

(30) Foreign Application Priority Data

Apr. 10, 2023 (CN) ......................... 202310384166.7

(51) Int. Cl.
*H10D 86/60* (2025.01)
*H10D 86/40* (2025.01)

(52) U.S. Cl.
CPC ........... *H10D 86/60* (2025.01); *H10D 86/441* (2025.01); *H10D 86/443* (2025.01)

(58) Field of Classification Search
CPC ..... H10D 86/60; H10D 86/441; H10D 86/443
See application file for complete search history.

(56) References Cited

U.S. PATENT DOCUMENTS 11,217,652 B2 * 1/2022 Jeon ..................... H10K 59/123
2004/0169808 A1 9/2004 Shih et al.
(Continued)

FOREIGN PATENT DOCUMENTS

CN 105487719 A 4/2016
CN 113160716 A 7/2021
(Continued)

OTHER PUBLICATIONS

PCT International Search Report for International Application No. PCT/CN2023/093737, mailed on Dec. 21, 2023, 11pp.
(Continued)

*Primary Examiner* — Tan N Tran
(74) *Attorney, Agent, or Firm* — The Roy Gross Law Firm, LLC; Roy D. Gross

(57) ABSTRACT

A display panel includes pixel circuitry disposed on a substrate. The pixel circuitry includes a plurality of transistor groups and a plurality of signal line groups. The plurality of transistor groups are divided into a plurality of transistor group columns by the signal line groups. Each transistor group is disposed between two adjacent signal line groups. Each signal line group includes a power supply signal line and a first data signal line. The power supply signal line at least partially overlaps the first data signal line in a thickness direction of the display panel. The power supply signal line is provided with at least one through hole. The first data signal line overlaps the through hole in the thickness direction.

19 Claims, 4 Drawing Sheets

(56) References Cited

U.S. PATENT DOCUMENTS

| | | | | |
|---|---|---|---|---|
| 2022/0310750 | A1* | 9/2022 | Yu | H10K 59/131 |
| 2023/0035054 | A1* | 2/2023 | Koo | G09G 3/3275 |
| 2023/0337466 | A1* | 10/2023 | Cheng | H10K 59/1216 |

FOREIGN PATENT DOCUMENTS

| | | | |
|---|---|---|---|
| CN | 113672117 | A | 11/2021 |
| CN | 114170903 | A | 3/2022 |
| CN | 114708796 | A | 7/2022 |
| CN | 115377125 | A | 11/2022 |

OTHER PUBLICATIONS

PCT Written Opinion of the International Searching Authority for International Application No. PCT/ CN2023/093737, mailed on Dec. 21, 2023, 7pp.

* cited by examiner

| B→W | Fluctuation Shape Of Electrical Signal | Fluctuation In Value Of Electrical Signal |
|---|---|---|
| Before Optimization | | 96mV |
| After Optimization | | 64mV |
| W→B | Fluctuation Shape Of Electrical Signal | Fluctuation In Value Of Electrical Signal |
| Before Optimization | | 97mV |
| After Optimization | | 65mV |

DISPLAY PANELS

CROSS-REFERENCE TO RELATED APPLICATIONS

This application is a continuation of International Application No. PCT/CN2023/093737, filed on May 12, 2023, which claims priority to and the benefit of Chinese Patent Application No. 202310384166.7, filed on Apr. 10, 2023. The disclosures of the aforementioned applications are incorporated herein by reference in their entireties.

TECHNICAL FIELD

The present application relates to display technologies, and more particularly, to display panels.

BACKGROUND

With the development of display technology, a display panel has been widely used in people's lives, such as in a display screen of a cell phone, a computer, a television, or the like. With the development of life and technology, requirements for display performance of the display panel are increased, the resolution of the display panel is increased, the number of lines in wiring in the display panel is increased, and the wiring becomes denser. In particular, in an organic light-emitting diode (OLED) display panel, light-emitting devices are driven by a complex pixel drive circuit, and thus the wiring in the organic light-emitting display panel further becomes denser.

However, due to the denser wiring in the current display panel, there are overlaps between lines of different potentials in a thickness direction of the display panel, and large parasitic capacitances are generated at the overlaps, so that signal crosstalk (interference) occurs between different lines, thereby reducing the display quality of the display panel.

SUMMARY

In view of the above, an embodiment of the present application provides a display panel including a substrate and pixel circuitry disposed on the substrate, wherein the pixel circuitry comprises a plurality of transistor groups and a plurality of signal line groups, each of the signal line groups comprises a power supply signal line and a first data signal line both extending in a first direction, the plurality of transistor groups are divided into a plurality of transistor group columns by the signal line groups, each of the signal line groups is disposed between two adjacent ones of the transistor group columns, and each of the transistor groups is disposed between two adjacent ones of the signal line groups; and

- in each of the signal line groups, a width of the power supply signal line is greater than a width of the first data signal line, the power supply signal line at least partially overlaps the first data signal line in a thickness direction of the display panel, a part of the power supply signal line overlapping the first data signal line is provided with at least one through hole, and the first data signal line overlaps the through hole in the thickness direction of the display panel.

Alternatively, in some embodiments of the present application, each of the signal line groups further comprises a second data signal line, and in each of the signal line groups, the second data signal line and the first data signal line are arranged side by side in parallel, and the second data signal line does not overlap the power supply signal line in the thickness direction of the display panel.

Alternatively, in some embodiments of the present application, the first data signal line and the second data signal line respectively in every two adjacent ones of the signal line groups are configured to drive ones of the transistor groups respectively in different rows each being in a second direction perpendicular to the first direction, the first data signal line and the second data signal line in each of the signal line groups are configured to drive ones of the transistor groups in a same row in the second direction, and each of the transistor groups is coupled to one of the first data signal line and the second data signal line.

Alternatively, in some embodiments of the present application, the first data signal line is straight, and the power supply signal line is not straight.

Alternatively, in some embodiments of the present application, the power supply signal line comprises a first segment and a second segment both extending in the first direction, and a third segment connected between the first segment and the second segment, the first segment being not aligned with the second segment, in each of the signal line groups, the first segment overlaps the first data signal line in the thickness direction of the display panel, the through hole is disposed in the first segment, and the second segment does not overlap the first data signal line in the thickness direction of the display panel.

Alternatively, in some embodiments of the present application, the through hole extends in the first direction.

Alternatively, in some embodiments of the present application, a width of the through hole in a second direction perpendicular to the first direction is greater than the width of the first data signal line.

Alternatively, in some embodiments of the present application, a distance between two outermost edges of the first segment away from the through hole in a second direction perpendicular to the first direction is greater than a width of the second segment.

Alternatively, in some embodiments of the present application, the display panel has a layer structure includes:

- an active layer disposed on the substrate, the active layer comprising semiconductor layers respectively corresponding to a plurality of thin film transistors;
- a first metal layer disposed on a side of the active layer away from the substrate, wherein the first metal layer comprises a source, a drain, and the power supply signal line, and the source and the drain are at least electrically connected to one of the semiconductor layers corresponding to one of the thin film transistors;
- a first insulating layer disposed on a side of the first metal layer away from the substrate; and
- a second metal layer disposed on a side of the first insulating layer away from the substrate, the second metal layer comprising the first data signal line.

Alternatively, in some embodiments of the present application, a material of the first metal layer is same as that of the second metal layer, and a thickness of the first metal layer is greater than a thickness of the second metal layer.

Alternatively, in some embodiments of the present application, the first metal layer comprises a laminate of titanium-layer/aluminum-layer/titanium-layer, and a thickness of the aluminum-layer is greater than or equal to 7000 angstroms.

Alternatively, in some embodiments of the present application, a width of a part of the first segment at either side of the through hole in a second direction perpendicular to the first direction is greater than or equal to 1.9 microns.

BRIEF DESCRIPTION OF THE DRAWINGS

In order to explain technical solutions in embodiments of the present application more clearly, the accompanying drawings required for the description of the embodiments are briefly described. It will be apparent that the accompanying drawings in the following description are merely some of the embodiments of the present application, and other drawings may be made to those skilled in the art from these accompanying drawings without involving any inventive effort.

DETAILED DESCRIPTION

Figure 1:
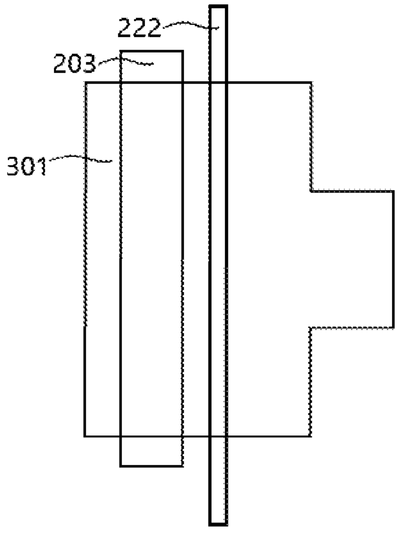
FIG. 1 is a schematic top view of a portion of wiring in a display panel in the related art.

Technical solutions in embodiments of the present application will be clearly and completely described below in conjunction with the accompanying drawings in the embodiments of the present application. It will be apparent that the described embodiments are merely a portion of the embodiments of the present application, rather than all the embodiments. Based on the embodiments in the present application, all other embodiments obtained by a person skilled in the art without involving any inventive effort are within the scope of the present application. Furthermore, it is to be understood that the embodiments described herein are for illustration and explanation only and are not intended to limit the application. In the present application, unless indicated to the contrary, the use of positional terms such as “upper” and “lower” are generally used to refer to upper and lower parts of the device in actual use or operation, in an embodiment, the orientation of the drawing. However, “inner/inside” and “outer/outside” refer to the contours of the device.

FIG. 1 is a schematic top view of a portion of wiring in a display panel in the related art. As the resolution of the display panel is increased, the number of lines in the wiring in the display panel is increased, and the wiring in the display panel becomes denser. FIG. 1 illustrates that both a power supply signal line and a first data signal line 222 overlap a transistor group 301 in a thickness direction of the display panel in the related art. It is easy to understand that the transistor group may include a plurality of thin film transistors of a driving circuit, and the power supply signal line does not overlap the first data signal line 222 in the thickness direction of the display panel. such a design results in a coupling capacitance between an element such as an electrode in the transistor group 301 and the power supply signal line and a coupling capacitance between an element such as an electrode in the transistor group 301 and the first data signal line 222. An electric signal through an element such as an electrode in the transistor group 301 and an electric signal through the power supply signal line are influenced by each other, and an electric signal through an element such as an electrode in the transistor group 301 and an electric signal through the first data signal line 222 are influenced by each other, so that the electric signal through the power supply signal line and the electric signal through the first data signal line 222 both have a degraded phenomenon such as the signal delay.

Figure 2:
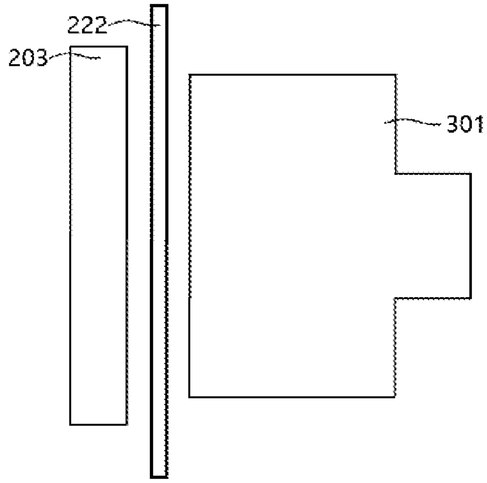
FIG. 2 is a schematic top view of a portion of wiring according to a first initial design by the inventors.

FIG. 2 is a schematic top view of a portion of wiring according to a first initial design by the inventors. Based on the above problem in FIG. 1, the power supply signal line and the first data signal line 222 are provided on a same side of the transistor group 301. Therefore, the power supply signal line and the first data signal line 222 do not overlap the transistor group in the thickness direction of the display panel. However, due to the greater resolution of the display panel, a layout space (or layout) of the display panel is limited, and the power supply signal line and the first data signal line 222 may not be expected to be arranged with the overlap in the thickness direction of the display panel, that is, there is not enough space on the layout to set the design in FIG. 2.

Figure 3:
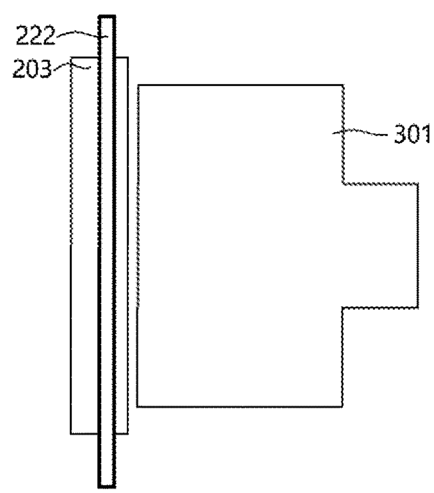
FIG. 3 is a schematic top view of a portion of wiring according to a second initial design by the inventors.

FIG. 3 is a schematic top view of a portion of wiring according to a second initial design by the inventors. Based on the above problem in FIG. 2, the power supply signal line overlaps the first data signal line 222 in the thickness direction of the display panel. Although the problem that the layout space of the display panel in FIG. 2 is limited is solved, a large parasitic capacitance is generated at the overlap between the power supply signal line and the first data signal line 222, so that signal crosstalk (interference) occurs between different lines in the wiring, thereby reducing the display quality of the display panel. For example, the first data signal line 222 is a data signal wiring (Data) and the power supply signal line 203 is a VDD signal wiring. When the signal through the first data signal line 222 changes or varies, the potential on the power supply signal line 203 is changed to a certain extent by the capacitive coupling effect, so that the signal through the power supply signal line 203 is not stable enough, thereby reducing the brightness stability of the display panel.

Figure 4:
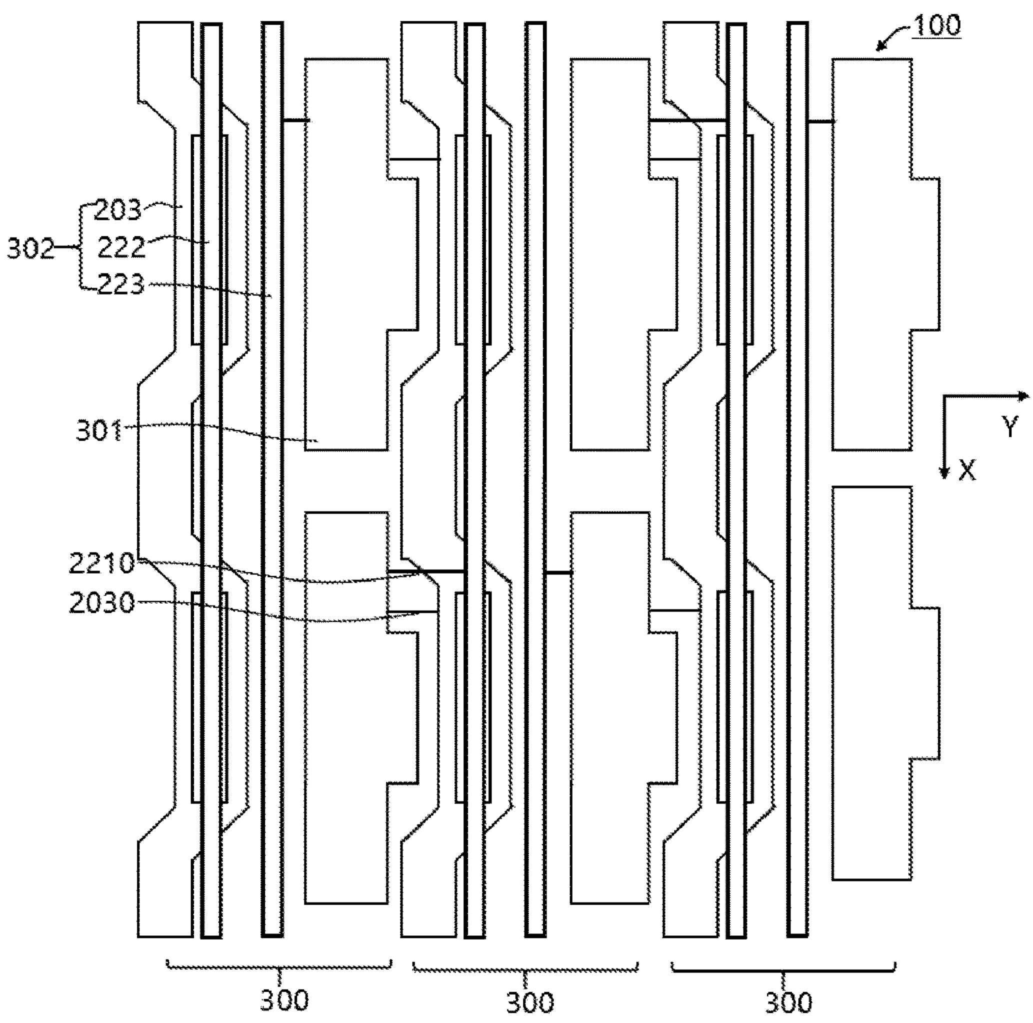
FIG. 4 is a schematic top view of a portion of wiring according to an embodiment of the present application.

FIG. 4 is a schematic top view of a portion of wiring according to an embodiment of the present application, and is also a wiring arrangement proposed in the present application. The arrangement of FIG. 4 is provided to solve the problems in the designs of FIGS. 1, 2, and 3. The subsequent embodiments will be described or illustrated in detail with reference to this embodiment.

To solve the above-described problems, in an embodiment of the present application, a display panel is provided. The display panel includes a substrate and pixel circuitry disposed on the substrate. The pixel circuitry includes a plurality of transistor groups and a plurality of signal line groups. The signal line group includes a power supply signal line and a first data signal line each extending in a first direction. The plurality of transistor groups are divided into a plurality of transistor group columns by the signal line groups. The signal line group is disposed between two adjacent ones of the transistor group columns. The transistor group is disposed between two adjacent ones of the signal line groups. A width of the power supply signal line is greater than a width of the first data signal line. The power supply signal line at least partially overlaps the first data signal line in the thickness direction of the display panel. A part of the power supply signal line overlapping the first data signal line is provided with at least one through hole, and the first data signal line overlaps the through hole in the thickness direction of the display panel.

Detailed descriptions are given below. It should be noted that the order in which the following embodiments are described is not intended to limit the preferred order of the examples.

Figure 5:
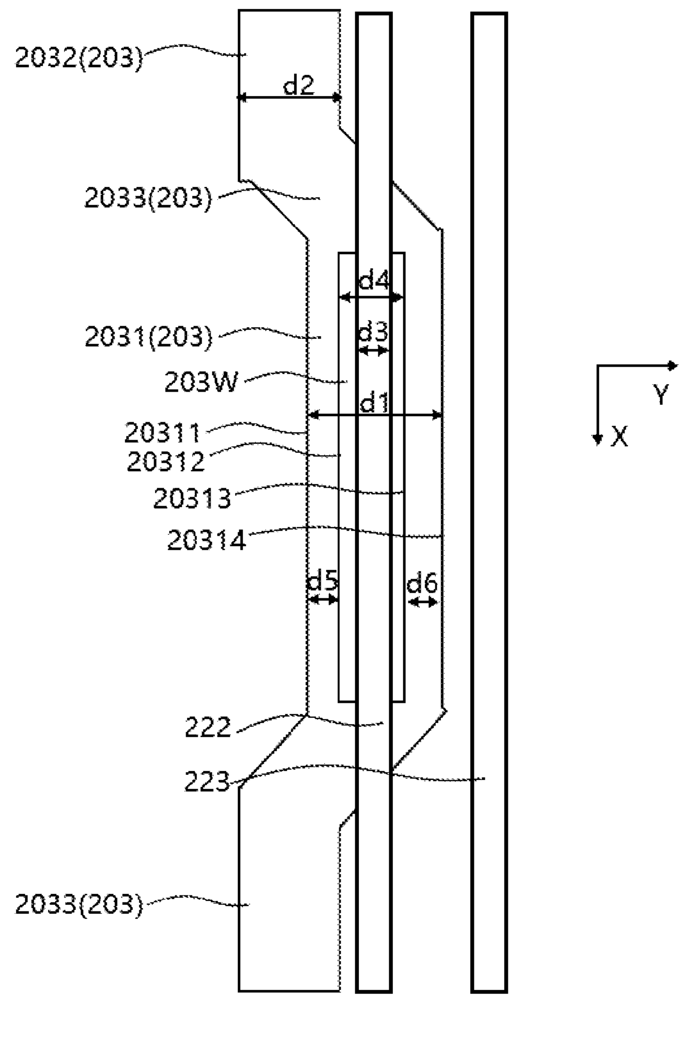
FIG. 5 is an enlarged schematic top view of a portion of wiring according to an embodiment of the present application.
Figures 6, 7:
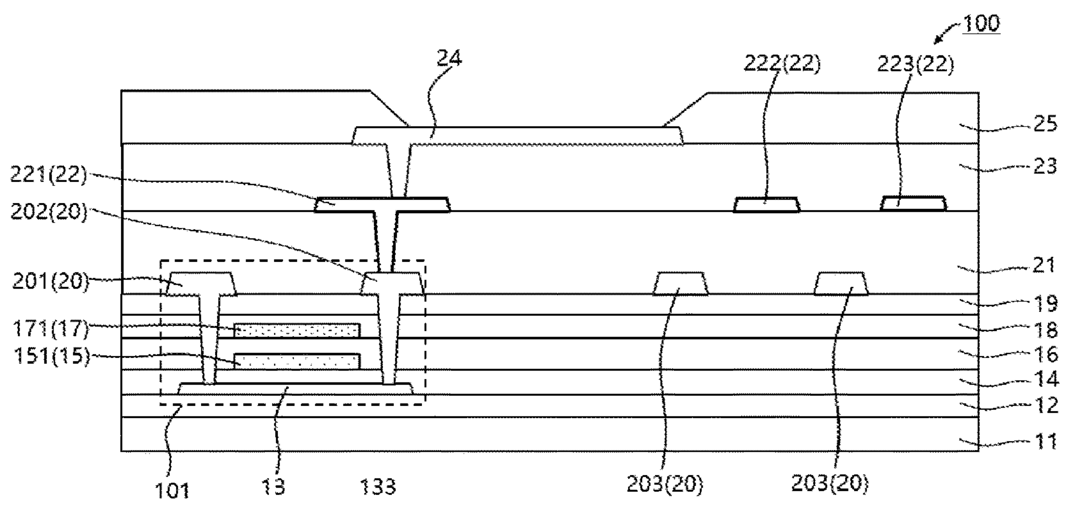
FIG. 6 is a schematic cross-sectional view of a portion of film layers of a display panel according to one or more embodiments of the present application.
FIG. 7 is a schematic diagram of a verification result of fluctuation of a VDD signal according to one or more embodiments of the present application.

FIG. 4 is a schematic top view of a portion of wiring according to an embodiment of the present application. FIG. 5 is an enlarged schematic top view of a portion of wiring according to an embodiment of the present application. FIG. 6 is a schematic cross-sectional view of a portion of film layers of a display panel according to one or more embodiments of the present application. To more clearly view the arrangement of the wiring of the present application, FIG. 5 is an enlarged schematic diagram of the wiring of FIG. 4.

In an embodiment of the present application, a display panel 100 includes a substrate 11 and pixel circuitry disposed on the substrate 11. The pixel circuitry includes a plurality of transistor groups 301 and a plurality of signal line groups 302. The signal line group 302 includes a power supply signal line 203 and a first data signal line 222 each extending in a first direction X. The plurality of transistor groups are divided into a plurality of transistor group columns 300 by the signal line groups 302. Each of the signal line groups 302 is disposed between two adjacent ones of the transistor group columns 300. Each of the transistor groups 301 is disposed between two adjacent ones of the signal line groups 302. A width of the power supply signal line 203 is greater than a width of the first data signal line 222. The power supply signal line 203 at least partially overlaps the first data signal line 222 in the thickness direction of the display panel 100. A part of the power supply signal line 203 overlapping the first data signal line 222 is provided with at least one through hole 203W, and the first data signal line 222 overlaps the through hole 203W in the thickness direction of the display panel 100.

In an embodiment, the power supply signal line 203 may be a VDD signal line, the first data signal line 222 may be a first Data signal line, and the transistor group 301 may include a plurality of thin film transistors of a pixel circuit.

In an embodiment, the pixel circuitry includes a plurality of transistor groups 301 and a plurality of signal line groups 302. The plurality of transistor groups are divided into a plurality of transistor group columns 300 by the signal line groups 302. Each of the signal line group 302 is disposed between two adjacent ones of the transistor group columns 300. Each of the transistor groups 301 is disposed between two adjacent ones of the signal line groups 302. Therefore, the arrangement may avoid the overlapping of the transistor group 301 and the signal line group 302 in the thickness direction of the display panel, and the large parasitic capacitance and the serious signal interference between the transistor group 301 and the signal line group 302, as described in FIGS. 1 to 3. The arrangement may cause the power supply signal line 203 at least partially overlaps the first data signal line 222 in the thickness direction of the display panel 100 due to the limited layout space.

In an embodiment, in order to solve the problem in FIG. 3, the power supply signal line 203 includes at least one through hole 203W at a portion of the power supply signal line 203 overlapped with the first data signal line 222, and the first data signal line 222 overlaps the through hole 203W in the thickness direction of the display panel 100. This arrangement reduces an effective overlap area of the power supply signal line 203 and the first data signal line 222, reduces the size of the parasitic capacitance, thereby reducing the signal crosstalk between the power supply signal line 203 and the first data signal line 222, and improves the display quality of the display panel.

In some embodiments, with reference to FIG. 4, the signal line group 302 further includes a second data signal line 223. In each of the signal line groups, the second data signal line 223 and the first data signal line 222 are arranged side by side in parallel. The second data signal line 223 does not overlap the power supply signal line 203 in the thickness direction of the display panel.

In an embodiment, in some arrangements of the display panel, for example, in a display panel driving configuration using Ramless IC, the signal line group 302 further includes a second data signal line 223.

In an embodiment, in each of the signal line groups, the second data signal line 223 and the first data signal line 222 are arranged side by side and in parallel, and the second data signal line 223 does not overlap the power supply signal line 203 in the thickness direction of the display panel, so that the limitation on the layout space may be improved, thereby further making the power supply signal line 203 at least partially overlap the first data signal line 222 in the thickness direction of the display panel 100.

In an embodiment, in order to avoid the larger parasitic capacitance and the signal interference between the first data signal line 222 and the second data signal line 223 and the power supply signal line 203, the second data signal line 223 does not overlap the power supply signal line 203 in the thickness direction of the display panel.

In some embodiments, the first data signal line 222 and the second data signal line 223 respectively in every two adjacent ones of the signal line groups 302 are configured to drive ones of the transistor groups 301 respectively in different rows each being in a second direction perpendicular to the first direction. The first data signal line 222 and the second data signal line 223 in each signal line group 302 are configured to drive ones of the transistor groups 301 in the same row in the second direction. Each of the transistor groups 301 is coupled to the first data signal line 222 or the second data signal line 223.

In an embodiment, as shown in FIG. 4, the first data signal line 222 and the second data signal line 223 in the signal line group 302 in an odd column are configured to drive the transistor groups 301 in an even row, respectively, and the first data signal line 222 and the second data signal line 223 in the signal line group 302 in an even column are configured to drive the transistor groups 301 in an odd row, respectively. Alternatively, the first data signal line 222 and the second data signal line 223 in the signal line group 302 in the odd column respectively are configured to drive the transistor group 301 in the odd row, respectively, and the first data signal line 222 and the second data signal line 223 in the signal line group 302 in the even column are configured to drive the transistor group 301 in the even row, respectively.

In an embodiment, as shown in FIG. 4, the first data signal line 222 and the second data signal line 223 are coupled or connected to the transistor groups 301 through first connection lines 2210, respectively, and the power supply signal line 203 is coupled or connected to the transistor group 301 through a second connection line 2030.

In some embodiments, the first data signal line 222 is straight, and the power supply signal line 203 is not straight.

In an embodiment, in order to reduce the impedance of the first data signal line 222, the first data signal line 222 is straight, and the second data signal line 223 may also be straight.

In an embodiment, in order to reduce the overlap area of the first data signal line 222 and the power supply signal line 203, the power supply signal line 203 may be not straight, that is, the first data signal line 222 at least partially overlaps the power supply signal line 203.

In some embodiments, the power supply signal line 203 includes a first segment 2031 and a second segment 2032 each extending in the first direction, and a third segment 2033 connected between the first segment 2031 and the second segment 2032. The first segment 2031 is not aligned with the second segment 2032. In each of the signal line groups, the first segment 2031 overlaps the first data signal line 222 in the thickness direction of the display panel. The through hole 203W is disposed in the first segment 2031. The second segment 2032 does not overlap the first data signal line 222 in the thickness direction of the display panel.

In an embodiment, the first segment 2031 overlaps with the first data signal line 222 in the thickness direction of the display panel, and the second segment 2032 does not overlap with the first data signal line 222 in the thickness direction of the display panel, thereby further reducing the effective overlap area of the power supply signal line 203 and the first data signal line 222, and reducing the size of the parasitic capacitance, thereby reducing the signal crosstalk between the power supply signal line 203 and the first data signal line 222, thereby improving the display quality of the display panel.

In some embodiments, the through hole 203W extends along a same direction as that of the first data signal line 222.

In an embodiment, the through hole 203W extends along the same direction as that of a portion of the first data signal line 222 at the through hole 203W, that is, at the overlap, the through hole 203W extends along the same direction as that of the first data signal line 222, so that an effective overlap area of the power supply signal line 203 and the first data signal line 222 at the overlap may be minimized to the greatest extent, while avoiding excessive reduction of the width of the power supply signal line 203 and excessive increase of the resistance of the power supply signal line 203.

In some embodiments, a width of the through hole 203W is greater than the width of the first data signal line 222 in a direction perpendicular to the extension direction of the first data signal line 222.

In an embodiment, the width of the through hole 203W is greater than the width of the first data signal line 222 in the direction perpendicular to the extension direction of the first data signal line 222, that is, a fourth width d4 is greater than a third width d3 in FIG. 5. Therefore, the power supply signal lines 203 at both sides of the through hole 203W and the first data signal line 222 are arranged spaced apart from each other at the overlap in a plane parallel to the substrate 11, so that an effective overlap area of the power supply signal line 203 and the first data signal line 222 at the overlap may be minimized to the greatest extent, and the size of the parasitic capacitance is reduced to the greatest extent.

In some embodiments, in the direction perpendicular to the extension direction of the first data signal line 222, a distance between two outermost edges of the first segment 2031 away from the through hole 203W is greater than a width of the second segment 2032 or a width of the third segment 2033.

In an embodiment, in the first direction X, the distance between the two outermost edges of the first segment 2031 away from the through hole 203W is greater than the width of the second segment 2032 or the width of the third segment 2033, that is, a first width d1 is greater than a second width d2 in FIG. 5, so that the through hole 203W may be provided in the first segment 2031 while the first segment 2031 at the through hole 203W has a larger effective width, thereby avoiding an excessive increase in the resistance of the first segment 2031.

In some embodiments, referring to FIG. 6, a layer structure of the display panel 100 includes an active layer 13, a first metal layer 20, a first insulating layer 21, and a second metal layer 22. The active layer 13 including semiconductor layers of a plurality of thin film transistors 101 is provided on the substrate 11. The first metal layer 20 is disposed on a side of the active layer 13 away from the substrate 11. The first metal layer 20 includes a source 201 and a drain 202, and a power supply signal line 203. The source 201 and the drain 202 are electrically connected to the semiconductor layer of at least one thin film transistor 101. The first insulating layer 21 is provided on a side of the first metal layer 20 away from the substrate 11. The second metal layer 22 is provided on a side of the first insulating layer 21 away from the substrate 11, and includes a first data signal line 222.

In an embodiment, the second metal layer 22 may further include a second data signal line 223.

In an embodiment, in FIG. 6, a film lamination of the display panel includes a substrate 11, a buffer layer 12, an active layer 13, a first gate insulating layer 14, a first gate metal layer 15, a second gate insulating layer 16, a second gate metal layer 17, a first interlayer insulating layer 18, a second interlayer insulating layer 19, a first metal layer 20, a first insulating layer 21, a second metal layer 22, a second flat layer 23, an anode 24, and a pixel definition layer 25, which are sequentially laminated. The display panel 100 further includes a thin film transistor 101 including a semiconductor layer formed by patterning the active layer 13, a first gate 151 located at the first gate metal layer 15, and a source 201 and a drain 202 located at the first metal layer 20. A second gate or capacitor electrode 171 located at the second gate metal layer 17 or a capacitor electrode metal layer forms a capacitor with the first gate 151, and a first connection electrode 221 located at the second metal layer 22 is connected between the anode 24 and the drain 202.

In an embodiment, as shown in FIG. 6, the power supply signal line 203 is located in the first metal layer 20, the first data signal line 222 is located in the second metal layer 22, and the second data signal line 223 is located in the second metal layer 22, but it is not limited thereto.

In some embodiments, the material of the first metal layer 20 is same as that of the second metal layer 22, and the thickness of the first metal layer 20 is greater than the thickness of the second metal layer 22.

In an embodiment, as shown in FIG. 6, the material of the power supply signal line 203 is same as that of the first data signal line 222, and the thickness of the power supply signal line 203 is greater than the thickness of the first data signal line 222, so that the resistance of the power supply signal line 203 is reduced by increasing the thickness of the power supply signal line 203, and the resistance of the power supply signal line 203 is prevented from being increased due to the through hole 203W.

In some embodiments, the first metal layer 20 includes a laminate of titanium-layer/aluminum-layer/titanium-layer, and a thickness of the aluminum-layer is greater than or equal to 7000 angstroms.

In an embodiment, each of the power supply signal line 203 and the first data signal line 222 includes a laminate of titanium-layer/aluminum-layer/titanium-layer (Ti/Al/Ti), and a thickness of the aluminum-layer in the power supply signal line 203 is greater than or equal to 7000 angstroms, so that the resistance of the power supply signal line 203 may be reduced.

In an embodiment, the thickness of the aluminum-layer in the power supply signal line 203 is greater than or equal to 7000 angstroms, the thickness of the aluminum layer in the first data signal line 222 is greater than or equal to 6000 angstroms, and the thickness of the aluminum layer in the power supply signal line 203 is greater than the thickness of the aluminum layer in the first data signal line 222, so that the resistance of the power supply signal line 203 is prevented from being increased due to the through hole 203W.

In some embodiments, the width of a part of the first segment 2031 at either side of the through hole 203W in a second direction perpendicular to the first direction is greater than or equal to 1.9 microns.

In an embodiment, in FIG. 5, the width of the first segment 2031 at either side of the through hole 203W is greater than or equal to 1.9 microns, that is, a fifth width d5 and a sixth width d6 are both greater than or equal to 1.9 microns, so that the power supply signal line 203 at the through hole 203W is prevented from being broken due to etching or the like.

Note that in FIG. 4, the edges of the power supply signal line 203 at one side of the through hole 203W are a first edge 20311 and a second edge 20312, respectively, and the edges of the power supply signal line 203 at the other side of the through hole 203W are the third edge 20313 and the fourth edge 20314, respectively.

FIG. 7 is a schematic diagram of a verification result of fluctuation of a VDD signal according to the present application. In FIG. 7, the condition "B→W" indicates that a black picture is switched to a white picture, the condition "W→B" indicates that the white picture is switched to the black picture, the condition "before optimization" indicates that the power supply signal line 203 in FIG. 4 or FIG. 5 is not provided with the through hole 203W, and the condition "after optimization" indicates that the power supply signal line 203 in FIG. 4 or FIG. 5 is provided with the through hole 203W. As can be seen from FIG. 7, the optimized condition in an embodiment of the present application reduces the fluctuation of the electrical signal through the power supply signal line 203 from 95 mV to 65 mV. The optimized condition makes the fluctuation of the electrical signal through the power supply signal line 203 less than or equal to 65 mV, thereby achieving a very good improvement.

It should be noted that both the power supply signal line 203 and the first data signal line 222 extend in the first direction X, and the second direction Y is a direction perpendicular to the direction in which the data signal line 222 extends, that is, the first direction X is perpendicular to the second direction Y.

The display panels according to some embodiments of the present application are described above in detail. Specific examples are used to illustrate the principles and embodiments of the present application. The description of the above embodiments is merely provided to assist in understanding the method of the present application and the core concept thereof. Meantime, variations will occur for those skilled in the art in both the detailed description and the scope of the present application in accordance with the teachings of the present application. In view of the foregoing, the presented description should not be construed as limiting the application.

What is claimed is:

1. A display panel comprising a substrate and pixel circuitry disposed on the substrate, wherein the pixel circuitry comprises a plurality of transistor groups and a plurality of signal line groups, each of the signal line groups comprises a power supply signal line and a first data signal line both extending in a first direction, the plurality of transistor groups are divided into a plurality of transistor group columns by the signal line groups, each of the signal line groups is disposed between two adjacent ones of the transistor group columns, and each of the transistor groups is disposed between two adjacent ones of the signal line groups; and in each of the signal line groups, a width of the power supply signal line is greater than a width of the first data signal line, the power supply signal line at least partially overlaps the first data signal line in a thickness direction of the display panel, a part of the power supply signal line overlapping the first data signal line is provided with at least one through hole, and the first data signal line overlaps the through hole in the thickness direction, wherein the power supply signal line comprises a first segment and a second segment both extending in the first direction, and a third segment connected between the first segment and the second segment, the first segment being not aligned with the second segment, and in each of the signal line groups, the first segment overlaps the first data signal line in the thickness direction, the through hole is disposed in the first segment, and the second segment does not overlap the first data signal line in the thickness direction, and wherein the through hole is configured to reduce an overlap area of the power supply signal line and the first data signal line and to reduce a parasitic capacitance between the power supply signal line and the first data signal line.

2. The display panel of claim 1, wherein each of the signal line groups further comprises a second data signal line, and in each of the signal line groups, the second data signal line and the first data signal line are arranged side by side in parallel, and the second data signal line does not overlap the power supply signal line in the thickness direction.

3. The display panel of claim 2, wherein the first data signal line and the second data signal line respectively in every two adjacent ones of the signal line groups are configured to drive ones of the transistor groups respectively in different rows each being in a second direction perpendicular to the first direction, the first data signal line and the second data signal line in each of the signal line groups are configured to drive ones of the transistor groups in a same row in the second direction, and each of the transistor groups is coupled to one of the first data signal line and the second data signal line.

4. The display panel of claim 2, wherein the first data signal line is straight, and the power supply signal line is not straight.

5. The display panel of claim 4, wherein the through hole extends in the first direction.

6. The display panel of claim 4, wherein a width of the through hole in a second direction perpendicular to the first direction is greater than the width of the first data signal line.

7. The display panel of claim 4, wherein the display panel has a layer structure comprising:

an active layer disposed on the substrate, the active layer comprising semiconductor layers respectively corresponding to a plurality of thin film transistors;

a first metal layer disposed on a side of the active layer away from the substrate, wherein the first metal layer comprises a source, a drain, and the power supply signal line, and the source and the drain are at least electrically connected to one of the semiconductor layers corresponding to one of the thin film transistors;

a first insulating layer disposed on a side of the first metal layer away from the substrate; and a second metal layer disposed on a side of the first insulating layer away from the substrate, the second metal layer comprising the first data signal line.

8. The display panel of claim 7, wherein a material of the first metal layer is same as that of the second metal layer, and a thickness of the first metal layer is greater than a thickness of the second metal layer.

9. The display panel of claim 8, wherein the first metal layer comprises a laminate of titanium-layer/aluminum-layer/titanium-layer, and a thickness of the aluminum-layer is greater than or equal to 7000 angstroms.

10. The display panel of claim 2, wherein a distance between two outermost edges of the first segment away from the through hole in a second direction perpendicular to the first direction is greater than a width of the second segment.

11. The display panel of claim 1, wherein the first data signal line is straight, and the power supply signal line is not straight.

12. The display panel of claim 11, wherein the through hole extends in the first direction.

13. The display panel of claim 11, wherein a width of the through hole in a second direction perpendicular to the first direction is greater than the width of the first data signal line.

14. The display panel of claim 11, wherein the display panel has a layer structure comprising:

an active layer disposed on the substrate, the active layer comprising semiconductor layers respectively corresponding to a plurality of thin film transistors;

a first metal layer disposed on a side of the active layer away from the substrate, wherein the first metal layer comprises a source, a drain, and the power supply signal line, and the source and the drain are at least electrically connected to one of the semiconductor layers corresponding to one of the thin film transistors;

a first insulating layer disposed on a side of the first metal layer away from the substrate; and a second metal layer disposed on a side of the first insulating layer away from the substrate, the second metal layer comprising the first data signal line.

15. The display panel of claim 14, wherein a material of the first metal layer is same as that of the second metal layer, and a thickness of the first metal layer is greater than a thickness of the second metal layer.

16. The display panel of claim 15, wherein the first metal layer comprises a laminate of titanium-layer/aluminum-layer/titanium-layer, and a thickness of the aluminum-layer is greater than or equal to 7000 angstroms.

17. The display panel of claim 1, wherein a distance between two outermost edges of the first segment away from the through hole in a second direction perpendicular to the first direction is greater than a width of the second segment.

18. The display panel of claim 1, wherein a width of a part of the first segment on either side of the through hole in a second direction perpendicular to the first direction is greater than or equal to 1.9 microns.

19. The display panel of claim 1, wherein the through hole is an insulating hole.

* * * * *